(12) United States Patent
Kelkar

(10) Patent No.: US 6,943,608 B2
(45) Date of Patent: Sep. 13, 2005

(54) WIDE FREQUENCY RANGE VOLTAGE-CONTROLLED OSCILLATORS (VCO)

(75) Inventor: Ram Kelkar, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 10/707,250

(22) Filed: Dec. 1, 2003

(65) Prior Publication Data
US 2005/0116758 A1 Jun. 2, 2005

(51) Int. Cl.[7] .............................................. H03H 11/26
(52) U.S. Cl. ...................................... 327/274; 327/158
(58) Field of Search ................................. 327/158, 231, 327/266, 270, 274, 281; 331/111

(56) References Cited

U.S. PATENT DOCUMENTS 5,227,681 A * 7/1993 Koyama et al. ............... 327/65
5,422,529 A * 6/1995 Lee ............................. 327/536
5,614,855 A * 3/1997 Lee et al. ..................... 327/158
6,377,129 B1 * 4/2002 Rhee et al. .................. 331/111

* cited by examiner

Primary Examiner—Dinh T. Le
(74) Attorney, Agent, or Firm—Schmeiser, Olsen & Watts; Michael LeStrange

(57) ABSTRACT

A structure for a delay cell in a Voltage-Controlled Oscillators (VCO) and method for operating the delay cell. The delay cell comprises a latch and an impedance circuit (comprising resistance and capacitance elements). The impedance circuit electrically couples different nodes of the latch, a supply voltage, and ground. By adjusting the resistance of the impedance circuit, the time needed for the latch to switch states in response to the switching of an input coupled to the latch is adjusted accordingly. By choosing the appropriate nodes of the delay cell as input and output nodes of the delay cell, the delay time of the delay cell can be adjusted by adjusting the resistance of the impedance circuit. As a result, the operating frequency range of the VCO can be widened compared with prior art. Similar impedance circuits can be added to the delay cell to expand the operating frequency range of the VCO.

20 Claims, 4 Drawing Sheets

WIDE FREQUENCY RANGE VOLTAGE-CONTROLLED OSCILLATORS (VCO)

BACKGROUND OF INVENTION

1. Technical Field

The present invention relates to Voltage-Controlled Oscillators (VCOs), and more specifically, to VCOs that have wide operating frequency ranges.

2. Related Art

A conventional Voltage-Controlled Oscillators (VCO) comprises multiple delay cells electrically coupled in series and in a loop. More specifically, the outputs of the first delay cell of the VCO are electrically coupled to the inputs of the second delay cell. The outputs of the second delay cell are electrically coupled to the inputs of the third delay cell, and so on. Finally, the outputs of the last delay cell are electrically coupled to the inputs of the first delay cell so as to form the loop. The outputs of any one delay cell of the conventional VCO can be used as the outputs of the VCO.

Each VCO has a specific operating frequency range. This means that the VCO can generate a stable signal with a frequency inside its operating frequency range. In other words, the VCO is not capable of generating a stable signal with a frequency outside its operating frequency range. As a result, it is always desirable to design VCOs having wider operating frequency ranges.

Therefore, a design of a novel VCO that has an operating frequency range relatively wider than that of conventional VOCs is needed. A method is also needed for operating the novel VCO.

SUMMARY OF INVENTION

The present invention provides a delay cell, comprising (a) a latch comprising a first circuit and a second circuit being cross-coupled together; (b) a first circuit logic gate and a first circuit capacitor both being electrically coupled to the first circuit such that the first circuit, the first circuit logic gate, and the first circuit capacitor being in series; and (c) a first input logic gate electrically coupled to an output of the first circuit, the first input logic gate is configured to switch states, and the first and second circuits are configured to switch states at time t1 in response to the first input logic gate switching states at time t2, with a delay time between t1 and t2 depending on the voltage level of a gate terminal of the first circuit logic gate.

The present invention also provides a method for operating a delay cell, the method comprising the steps of (a) providing in the delay cell (i) a latch comprising a first circuit and a second circuit being cross coupled together, (ii) a first circuit logic gate and a first circuit capacitor both being electrically coupled to the first circuit such that the first circuit, the first circuit logic gate, and the first circuit capacitor being in series, and (iii) a first input logic gate electrically coupled to an output of the first circuit; (b) switching states of the first input logic gate; and (c) switching states of the first and second circuits at time t1 in response to the first input logic gate switching states at time t2, with a delay time between t1 and t2 depending on the voltage level of a gate terminal of the first circuit logic gate.

The present invention also provides a structure, comprising (a) a latch; (b) an input logic gate, electrically coupled to a first output of the latch; and (c) a first impedance circuit electrically coupled to the latch such that the first impedance circuit and the latch are in series, the first impedance circuit is configured to change its resistance in response to a control signal, and the latch is configured to switch states at time t1 in response to the input logic gate switching states at time t2, with a delay time between t1 and t2 depending on the resistance of the first impedance circuit.

The present invention provides structures for a novel VCO (Voltage-Controlled Oscillator) that has an operating frequency range relatively wider than that of conventional VCRs.

The present invention also provides methods for operating the novel VCO.

DETAILED DESCRIPTION

Figure 1:
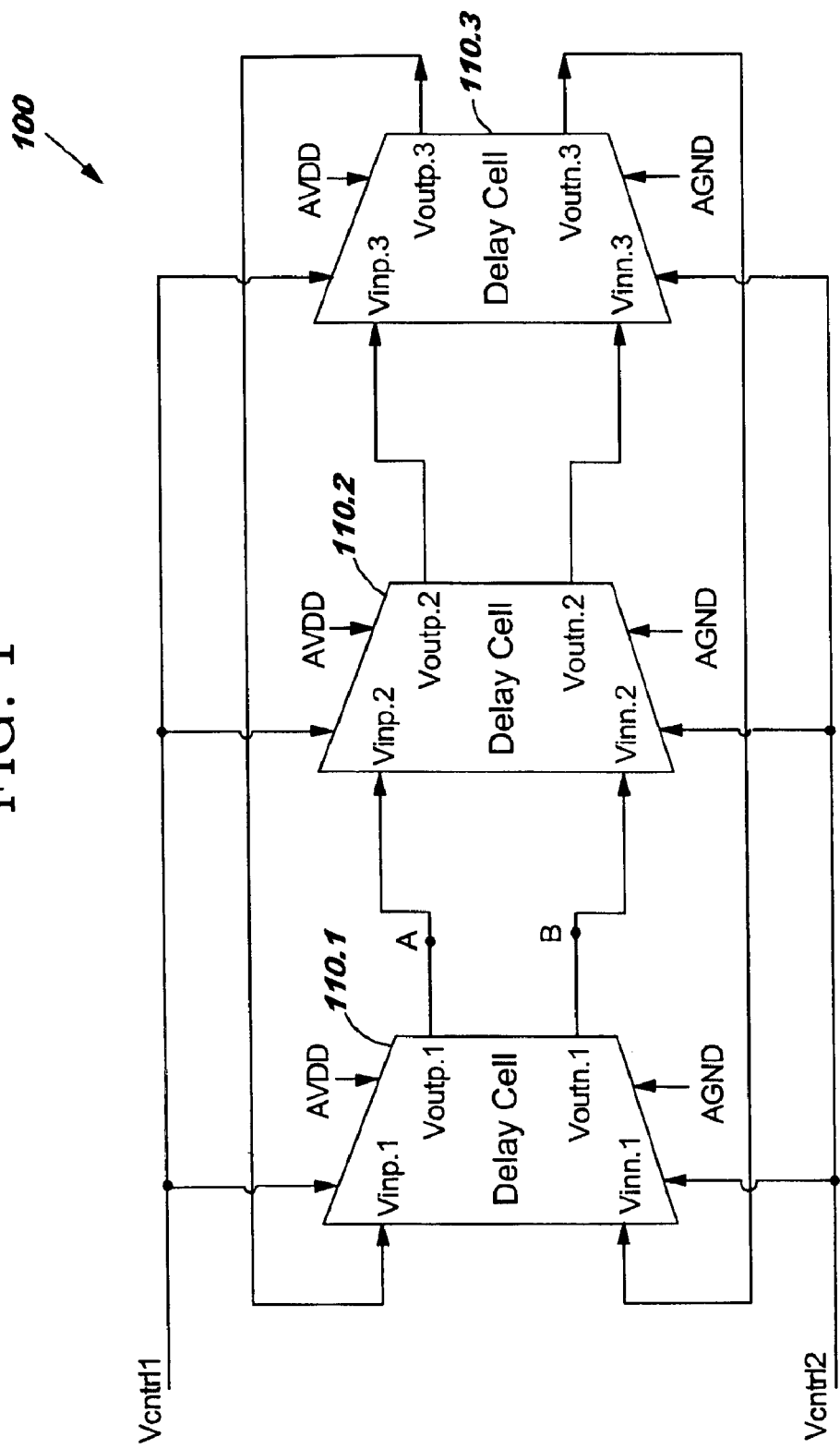
FIG. 1 illustrates a structure of a Voltage-Controlled Oscillators (VCO) comprising three delay cells, in accordance with embodiments of the present invention.

FIG. 1 illustrates a structure of a Voltage-Controlled Oscillators (VCO) 100 comprising three delay cells 110.1, 110.2, and 110.3, in accordance with embodiments of the present invention. Illustratively, the delay cell 110.1 comprises two input nodes Vinp.1 and Vinn.1 and two output nodes Voutp.1 and Voutn.1.

The delay cell 110.1 is electrically coupled to AVDD (supply voltage) and AGND (ground). The delay cell 110.1 receives two control signals Vcntrl1 and Vcntrl2 which control the delay time of the delay cell 110.1, as will be explained infra. In general, the delay time of a delay cell is the time it takes a signal to propagate from the inputs of the delay cell to its outputs.

Similarly, the delay cell 110.2 has two input nodes Vinp.2 and Vinn.2 and two output nodes Voutp.2 and Voutn.2. The delay cell 110.2 is electrically coupled to AVDD and AGND. The delay cell 110.1 receives two control signals Vcntrl1 and Vcntrl2 which control the delay time of the delay cell 110.2.

Similarly, the delay cell 110.3 has two input nodes Vinp.3 and Vinn.3 and two output nodes Voutp.3 and Voutn.3. The delay cell 110.3 is electrically coupled to AVDD and AGND. The delay cell 110.3 receives two control signals Vcntrl1 and Vcntrl2 which control the delay time of the delay cell 110.3.

In one embodiment, the output nodes Voutp.1 and Voutn.1 of the delay cell 110.1 is electrically coupled to the input nodes Vinp.2 and Vinn.2 of the delay cell 110.2, respectively. The output nodes Voutp.2 and Voutn.2 of the delay cell 110.2 is electrically coupled to the input nodes Vinp.3 and Vinn.3 of the delay cell 110.3, respectively. The output nodes Voutp.3 and Voutn.3 of the delay cell 110.3 is electrically coupled to the input nodes Vinp.1 and Vinn.1 of the delay cell 110.1, respectively, so as to form a loop.

In one embodiment, the voltage levels on the two control signals Vcntrl1 and Vcntrl2 are adjusted so as to adjust the delay times of the delay cells 110.1, 110.2, and 110.3. As a result, the operating frequency of the VCO 100 is adjusted accordingly.

If the delay times of the delay cells 110.1, 110.2, and 110.3 are increased, the operating frequency of the VCO 100 is decreased. If the delay times of the delay cells 110.1, 110.2, and 110.3 are decreased, the operating frequency of the VCO 100 is increased. As a result, when the delay times of the delay cells 110.1, 110.2, and 110.3 are adjusted to the maximum value, the VCO 100 operates at the minimum attainable frequency. When the delay times of the delay cells 110.1, 110.2, and 110.3 are adjusted to the minimum value, the VCO 100 operates at the maximum attainable frequency.

The use of two control signals Vcntrl1 and Vcntrl2 helps widen the delay range of each of the delay cells 110.1, 110.2, and 110.3, compared with the delay range of a conventional delay cell. As a result, the VCO 100 has an operating frequency range relatively wider than that of conventional VCOs. Nodes A and B, which are electrically coupled to the output nodes Voutp.1 and Voutn.1 of the delay cell 110.1, can be used as output nodes for the VCO 100.

In one embodiment, initially, the nodes A and B are electrically connected to AVDD and AGND, respectively. Then, the nodes A and B are electrically disconnected from AVDD and AGND, respectively. In response, the VCO 100 starts to operate at a frequency that depends on the delay time of each of the delay cells 110.1, 110.2, and 110.3. The delay time of each of the delay cells 110.1, 110.2, and 110.3 in turn depends on the voltage levels of the control signals Vcntrl1 and Vcntrl2.

Figure 2:
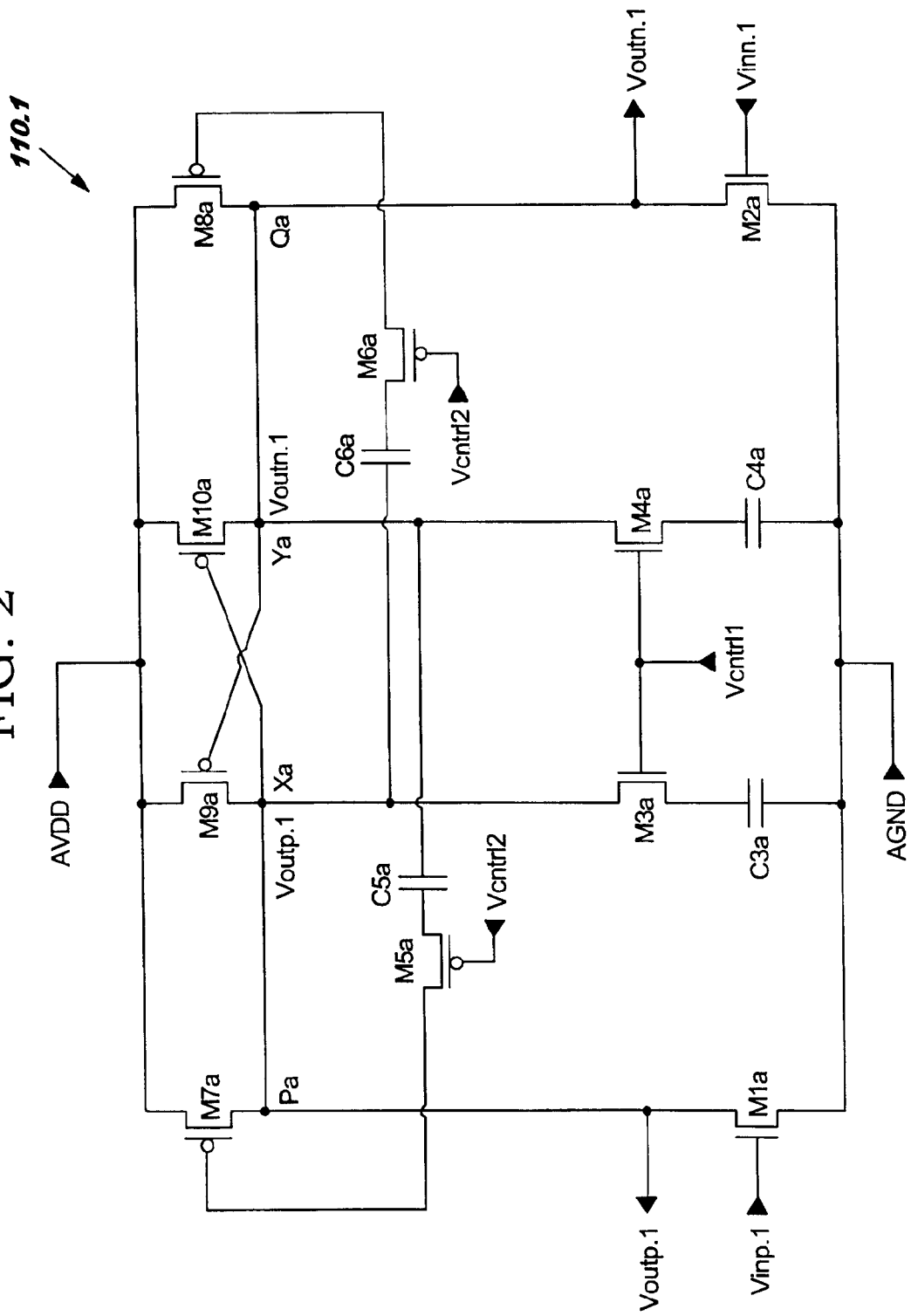
FIG. 2 illustrates one of the delay cells of FIG. 1, in accordance with embodiments of the present invention.

FIG. 2 illustrates the delay cell 110.1 of FIG. 1, in accordance with embodiments of the present invention. Illustratively, the delay cell 110.1 comprises N-channel transistors M1a, M2a, M3a, and M4a, and P-channel transistors M5a, M6a, M7a, M8a, M9a, and M10a. The delay cell 110.1 also comprises capacitors C3a, C4a, C5a, and C6a.

The transistors M1a and M7a are electrically coupled in series between AVDD and AGND. Pa is a common node of the transistors M1a and M7a. Similarly, the transistors M2a and M8a are electrically coupled in series between AVDD and AGND. Qa is a common node of the transistors M2a and M8a.

The capacitor C3a and the transistors M3a and M9a are electrically coupled in series between AVDD and AGND. Xa is a common node of the transistors M3a and M9a. Similarly, the capacitor C4a and the transistors M4a and M10a are electrically coupled in series between AVDD and AGND. Node Ya is a common node of the transistors M4a and M10a.

Node Xa is electrically coupled to the gate of the transistor M10a and to the node Pa. Node Xa is also electrically coupled to the gate of the transistor M8a via the capacitor C6a and the transistor M6a. Similarly, node Ya is electrically coupled to the gate of the transistor M9a and to the node Qa. Node Ya is also electrically coupled to the gate of the transistor M7a via the capacitor C5a and the transistor M5a.

In effect, transistors M9a and M10a form a latch, with transistors M3a and M4a controlling the loading on the latch. Transistors M7a and M8a also form a latch that works in parallel with the latch formed by M9a, M10a. Transistors M6a and M5a are used to change the impedance in the gates of transistors M7a and M8a.

In one embodiment, the gate (i.e., gate terminal) of the transistor M1a is used as the input node Vinp.1 of the delay cell 110.1. The gate of the transistor M2a is used as the input node Vinn.1 of the delay cell 110.1. The node Pa is used as the output node Voutp.1 of the delay cell 110.1. The node Qa is used as the output node Voutn.1 of the delay cell 110.1.

In one embodiment, the gates of the transistors M3a and M4a are electrically coupled to the control signal Vcntrl1. By adjusting Vcntrl1, the amount of capacitance loading on the latch M9a, M3a, M10a, M4a can be adjusted. In other words, by adjusting Vcntrl1, loading on the nodes Xa and Ya are adjusted. The gates of the transistors M5a and M6a are electrically coupled to the control signal Vcntrl2.

The operation of the delay cell 110.1 can be described in short as follows (detailed description is in the example below). When Vcntrl1 is increased, the resistances of the transistors M3a and M4a are decreased. As a result, the loading on the nodes Xa and Ya is increased. Therefore, it takes more time for the nodes Xa and Ya to change states (i.e., from low to high, or from high to low). As a result, the delay time of the delay cell 110.1 is increased, and the operating frequency of the VCO 100 (FIG. 1) is decreased.

When Vcntrl2 is decreased, resistance of the transistor M5a is decreased. As a result, the impedance of the combination of transistor M5a and capacitor C5a is decreased. Therefore, whenever node Xa is pulled up by transistor M9a, transistor M7a is turned on more to help pull node Xa up faster. This happens because node Ya is pulled down when node Xa is being pulled up, and since the impedance in the gate of M7a is reduced, the effect of Ya being pulled down turns on M7a sooner. As a result, the delay time of the delay cell 110.1 is reduced, and the operating frequency of the VCO 100 (FIG. 1) is increased.

Similarly, when Vcntrl2 is decreased, resistance of the transistor M6a is decreased. As a result, the impedance of the combination of transistor M6a and capacitor C6a is decreased. Therefore, whenever node Ya is pulled up by transistor M10a, transistor M8a is turned on more to help pull node Ya up faster. This happens because node Xa is pulled down when node Ya is being pulled up, and since the impedance in the gate of M6a is reduced, the effect of Xa being pulled down turns on M8a sooner. As a result, the delay time of the delay cell 110.1 is reduced, and the operating frequency of the VCO 100 (FIG. 1) is increased.

As an example of the operation of the delay cell 110.1, different situations are examined. For a situation A1, assume that initially node Vinp.1 is at AVDD (high), node Vinn.1 is at AGND (low), Vcntrl1 is low, and Vcntrl2 is high.

With Vcntrl1 being low, transistors M3a and M4a have high resistances. With Vcntrl2 being high, transistors M5a and M6a have high resistances.

Because node Vinp.1 is high, the transistor M1a has low resistance and, therefore, node Voutp.1 is low. Also, the nodes Xa and Pa are low. As a result, transistor M10a has low resistance.

Because node Vinn.1 is low, the transistor M2a has high resistance. With M10a having low resistance, the nodes Ya and Qa are pulled high. As a result, transistor M9a has high resistance.

Assume now that node Vinp.1 changes from high to low and node Vinn.1 changes from low to high simultaneously. The delay cell 110.1 is symmetrical, therefore, each element of the delay cell 110.1 will switch to the initial state of its symmetrical element. For instance, because transistors M1a and M2a are symmetrical elements of the delay cell 110.1, transistor M1a will switch to the initial state of transistor M2a (i.e., from having low resistance to having high resistance), and transistor M2a will switch to the initial state of transistor M1a (i.e., from having high resistance to having low resistance).

Node Xa will switch from low to high (which is the initial state of its symmetrical element: node Ya). Similarly, node Ya will switch from high to low. In other words, while input node Vinp.1 changes from high to low and input node Vinn.1 changes from low to high simultaneously, output node Voutp.1 changes from low to high and output node Voutn.1 changes from high to low simultaneously with some delay. In other words, the inputs of the delay cell 110.1 switching states causes the outputs of the delay cell 110.1 to switch states after some delay.

For a situation A2, assume that initially node Vinp.1 is at AVDD (high), node Vinn.1 is at AGND (low), Vcntrl1 is high, and Vcntrl2 is high. This assumption is the same as in situation A1 except that Vcntrl1 is high instead of low. As a result, node Xa is low and node Ya is high as in situation A1. However, with Vcntrl1 being high, both transistors M3a and M4a have low resistances. As a result, capacitor C3a is discharged, and capacitor C4a is charged.

Assume now that node Vinp.1 changes from high to low and node Vinn.1 changes from low to high simultaneously. As a result, node Xa switches from low to high and node Ya switches from high to low as in situation A1. However, because it takes time to charge up capacitor C3a, it takes more time for node Xa to switch from low to high than in Situation A1. Similarly, because it takes time to discharge capacitor C4a, it takes more time for node Ya to switch from high to low than in Situation A1. In short, raising the voltage level of Vcntrl1 increases the delay time of the delay cell 110.1.

For a situation A3, assume that initially node Vinp.1 is at AVDD (high), node Vinn.1 is at AGND (low), Vcntrl1 is low, and Vcntrl2 is low. This assumption is the same as in situation A1 except that Vcntrl2 is low instead of high. As a result, node Xa is low and node Ya is high as in situation A1. However, with Vcntrl2 being low, both transistors M5a and M6a have low resistances (i.e., having low resistances).

Assume now that node Vinp.1 changes from high to low and node Vinn.1 changes from low to high simultaneously. As a result, node Xa switches from low to high and node Ya switches from high to low as in situation A1.

With transistor M5a having low resistance, the gate voltage of transistor M7a follows closely the voltage of node Ya. As a result, transistor M7a turns on faster than in situation A1. Therefore, node Xa is pulled high faster than in situation A1. In effect, transistor M7a is a pull-up transistor.

Similarly, with M6a having low resistance, the gate voltage of transistor M8a follows closely the voltage of node Xa. As a result, transistor M8a turns off faster than in situation A1. Therefore, node Ya is pulled low faster than in situation A1. In effect, transistor M8a is a pull-up transistor. In short, lowering the voltage level of Vcntrl2 reduces the delay time of the delay cell 110.1.

For a situation A4, assume that initially node Vinp.1 is high, node Vinn.1 is low, Vcntrl1 is high, and Vcntrl2 is low. This assumption is the same as in situation A1 except that Vcntrl1 is high instead of low, and Vcntrl2 is low instead of high. As a result, node Xa is low and node Ya is high as in situation A1.

With Vcntrl1 being high, both transistors M3a and M4a have low resistances. As a result, the loading on the nodes Xa and Xb is increased.

With Vcntrl2 being low, both transistors M5a and M6a have low resistances (i.e., having low resistances). As a result, the impedance of the combination of transistor M5a and capacitor C5a is decreased. Also, the impedance of the combination of transistor M6a and capacitor C6a is decreased.

Assume now that node Vinp.1 changes from high to low and node Vinn.1 changes from low to high simultaneously. As a result, node Xa switches from low to high and node Ya switches from high to low as in situation A1.

On one hand, because the loading on the nodes Xa and Xb is increased, the delay time of the delay cell 110.1 is increased. On the other hand, because the impedance of the combination of transistor M5a and capacitor C5a is decreased, whenever node Xa is pulled up by transistor M9a, transistor M7a is turned on faster to help pull node Xa up faster. Similarly, because the impedance of the combination of transistor M6a and capacitor C6a is decreased, whenever node Ya is pulled up by transistor M10a, transistor M8a is turned on faster to help pull node Ya up faster. In other words, the delay time of the delay cell 110.1 is decreased. In effect, raising Vcntrl1 and lowering Vcntrl2 have opposite effects.

In summary, the use of the two control signals Vcntrl1 and Vcntrl2 helps expand the delay time of the delay cell 110.1 to a new high (by pulling both Vcntrl1 and Vcntrl2 high as in situation A2) and to a new low (by pulling both Vcntrl1 and Vcntrl2 low as in situation A3) compared with situation A1.

In one embodiment, the delay cell 110.2 and 110.2 have a structure similar to that of the delay cell 110.1. As a result, the operating frequency range of the VCO 100 can be expanded in both directions (low and high) using both the control signals Vcntrl1 and Vcntrl2.

Figure 3:
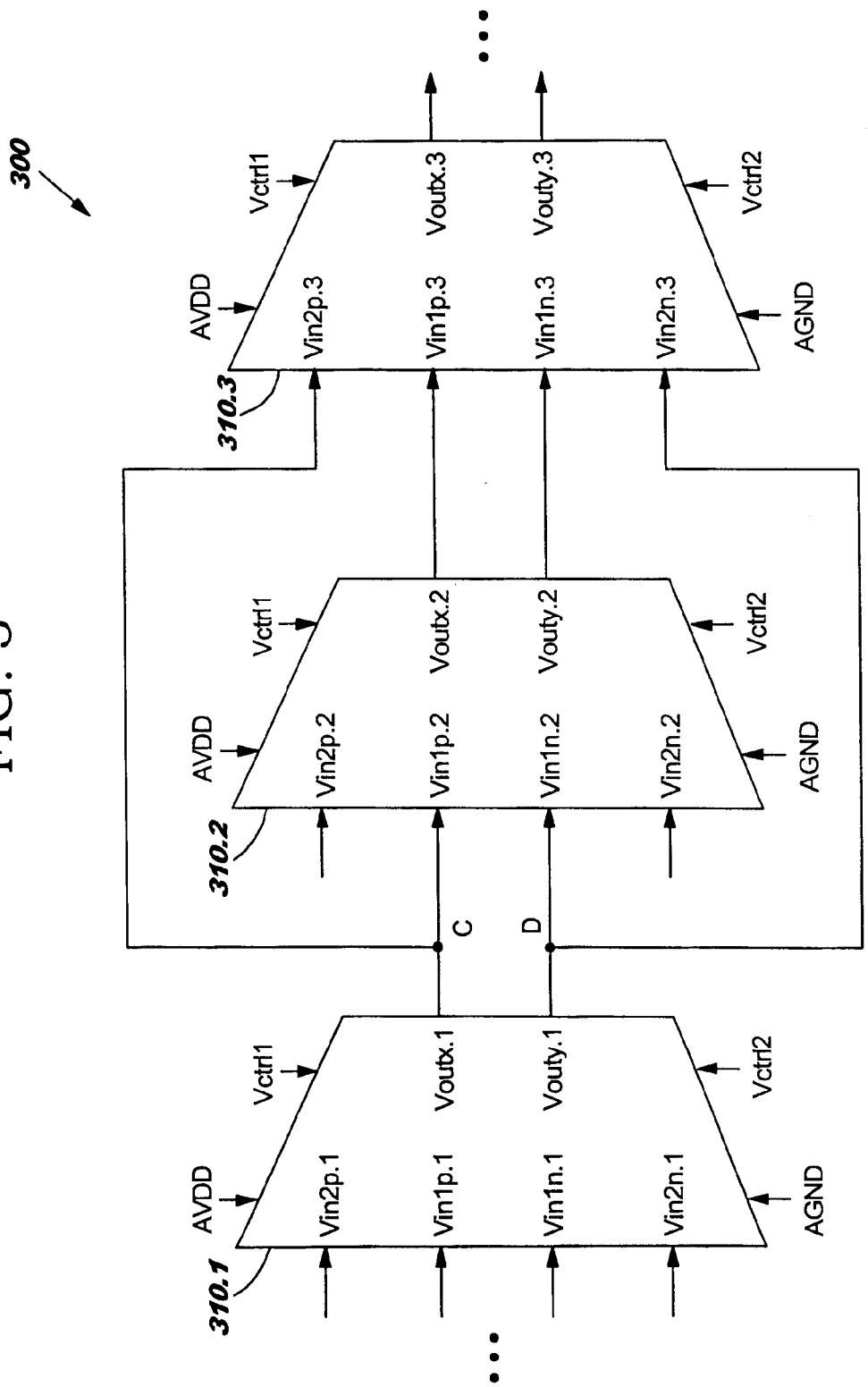
FIG. 3 illustrates a structure of a VCO comprising six delay cells, in accordance with embodiments of the present invention.

FIG. 3 illustrates a structure of a VCO 300 comprising six delay cells 310.1–310.6, in accordance with embodiments of the present invention. For simplicity, only three delay cells 310.1, 310.2, and 310.3 are shown.

Illustratively, the delay cell 310.1 has four input nodes Vin1p.1, Vin2p.1, Vin1n.1, and Vin2n.1, and two output nodes Voutx.1 and Vouty.1. The delay cell 310.1 is electrically coupled to AVDD and AGND. The delay cell 310.1 receives two control signals Vctrl1 and Vctrl2 which control the delay time of the delay cell 310.1. Each of the delay cells 310.2–310.6 has a structure similar to that of the delay cell 310.1.

In one embodiment, the output nodes Voutx.1 and Vouty.1 of the delay cell 310.1 are electrically coupled to the input nodes Vin1p.2 and Vin1n.2 of the delay cell 310.2, respectively. The output nodes Voutx.1 and Vouty.1 of the delay cell 310.1 are also electrically coupled to the input nodes Vin2p.3 and Vin2n.3 of the delay cell 310.2, respectively.

Each of the delay cells 310.2–310.6 has connections similar to those of the delay cell 310.1. As a result, the delay cells 310.1–310.6 are electrically coupled in series and in a loop. More specifically, the output nodes Voutx.5 and Vouty.5 of the delay cell 310.5 (not shown) are electrically coupled to the input nodes Vin1p.6 and Vin1n.6 of the delay cell 310.6 (not shown), respectively. The output nodes Voutx.5 and Vouty.5 of the delay cell 310.5 are also electrically coupled to the input nodes Vin2p.1 and Vin2n.1 of the delay cell 310.1, respectively.

The output nodes Voutx.6 and Vouty.6 of the delay cell 310.6 (not shown) are electrically coupled to the input nodes Vin1p.1 and Vin1n.1 of the delay cell 310.1, respectively. The output nodes Voutx.6 and Vouty.6 of the delay cell 310.6 are also electrically coupled to the input nodes Vin2p.2 and Vin2n.2 of the delay cell 310.2, respectively, and so on.

In one embodiment, the voltage levels on the two control signals Vctrl1 and Vctrl2 are adjusted so as to adjust the delay times of the delay cells 310.1–310.6. As a result, the operating frequency of the VCO 300 is adjusted accordingly.

If the delay times of the delay cells 310.1–310.6 are increased, the operating frequency of the VCO 300 is decreased. If the delay times of the delay cells 310.1–310.6 are decreased, the operating frequency of the VCO 300 is increased. As a result, when the delay times of the delay cells 310.1–310.6 are adjusted to the maximum value, the VCO 300 operates at the minimum attainable frequency. When the delay times of the delay cells 310.1–310.6 are adjusted to the minimum value, the VCO 300 operates at the maximum attainable frequency.

The use of two control signals Vctrl1 and Vctrl2 helps widen the delay range of each of the delay cells 310.1–310.6, compared with the delay range of a conventional delay cell. As a result, the VCO 300 has an operating frequency range relatively wider than that of conventional VCOs. Nodes C and D, which are electrically coupled to the output nodes Voutx.1 and Vouty.1 of the delay cell 310.1, can be used as output nodes for the VCO 300.

In one embodiment, initially, the nodes C and D are electrically connected to AVDD and AGND, respectively. Then, the nodes C and D are electrically disconnected from AVDD and AGND, respectively. In response, the VCO 300 starts to operate at a frequency that depends on the delay time of each of the delay cells 310.1–310.6. The delay time of each of the delay cells 310.1–310.6 in turn depends on the voltage levels of the control signals Vctrl1 and Vctrl2.

Figure 4:
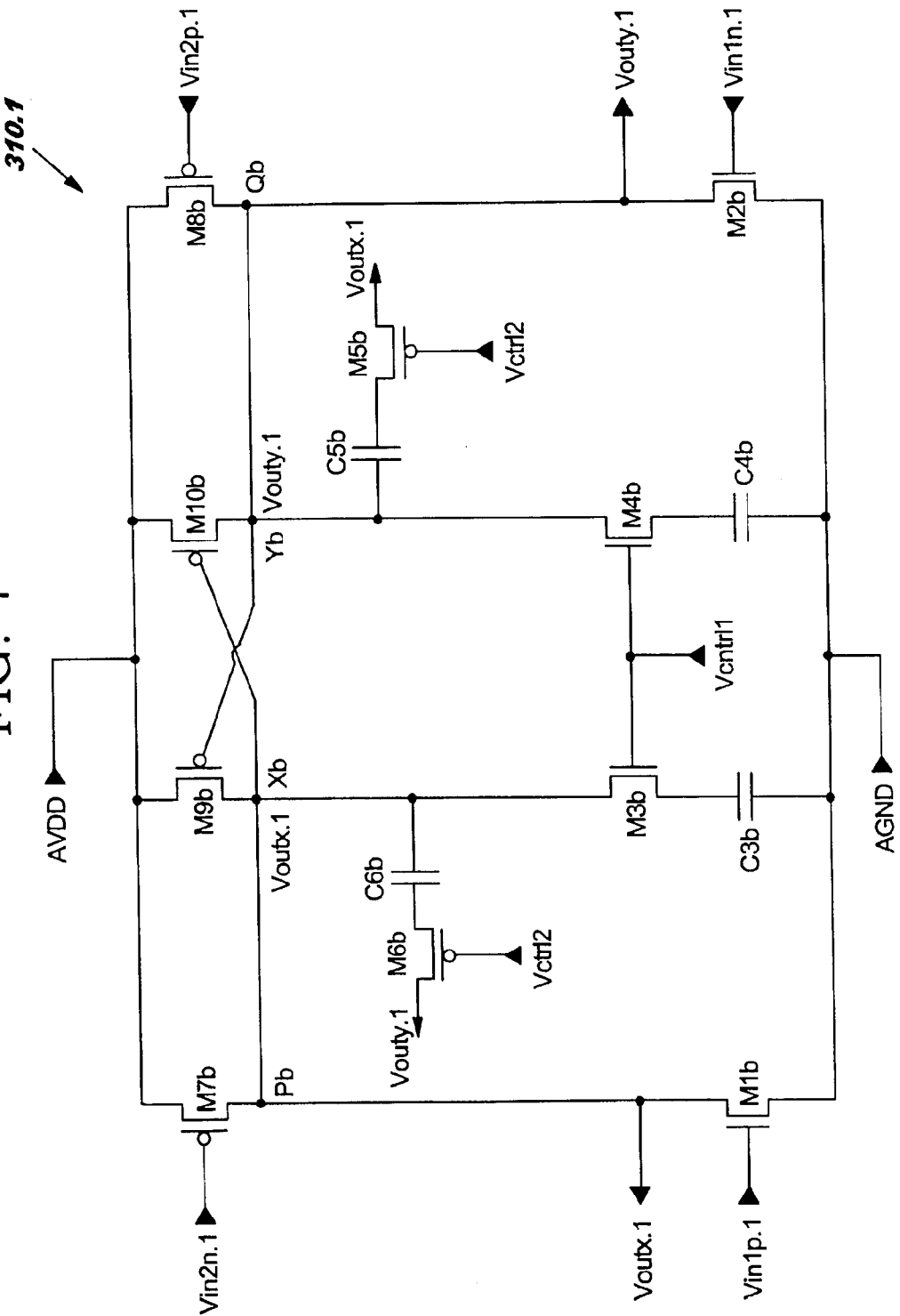
FIG. 4 illustrates one of the delay cells of FIG. 3, in accordance with embodiments of the present invention.

FIG. 4 illustrates the delay cell 310.1 of FIG. 3, in accordance with embodiments of the present invention. Illustratively, the delay cell 310.1 comprises N-channel transistors M1b, M2b, M3b, and M4b, and P-channel transistors M5b, M6b, M7b, M8b, M9b, and M10b. The delay cell 310.1 also comprises capacitors C3b, C4b, C5b, and C6b.

The structure and connections of the delay cell 310.1 are similar to that of the delay cell 110.1 (FIG. 2), except that (i) transistor M5b and capacitor C5b are electrically coupled in series between node Yb and node Xb instead of between node Yb and the gate of transistor M7b as in the delay cell 110.1, and (ii) transistor M6b and capacitor C6b are electrically coupled in series between node Xb and node Yb instead of between node Xb and the gate of transistor M8b as in the delay cell 110.1. In effect, transistor M5b and capacitor C5b are electrically coupled in series between the two output nodes Voutx.1 and Vouty.1 of the delay circuit 310.1. Similarly, in effect, transistor M6b and capacitor C6b are also electrically coupled in series between the two output nodes Voutx.1 and Vouty.1 of the delay circuit 310.1. In one embodiment, transistor M6b and capacitor C6b can be omitted from the delay cell 310.1.

As an example of the operation of the delay cell 310.1, different situations are examined. For a situation B1, assume that initially nodes Vin1p.1 and Vin2n.1 are high, and nodes Vin1n.1 and Vin2p.1 are low, Vctrl1 is low, and Vctrl2 is high. Situation B1 is similar to situation A1 of the delay cell 110.1, therefore node Xb is low and node Yb is high. Therefore, initially, node Voutx.1 is low and node Vouty.1 is high.

With Vctrl1 being low, transistors M3b and M4b have high resistances. Similarly, with Vctrl2 being high, transistors M5b and M6b have high resistances. Thus the loading on the latch M9b and M10b is small, and the capacitance added between nodes Voutx.1 and Vouty.1 through M6b and M5b is small.

Assume now that nodes Vin1p.1 and Vin2n.1 change from high to low, and nodes Vin1n.1 and Vin2p.1 change from low to high. Similar to situation A1 of FIG. 2, node Xb changes from low to high and node Yb changes from high to low. As a result, node Voutx.1 changes from low to high, and node Vouty.1 changes from high to low with some delay. In other words, the inputs of the delay cell 310.1 switching states causes the outputs of the delay cell 310.1 to switch states after some delay. The delay in this case is small because the capacitance added to the latch M9b, M10b is small, and also the capacitance added between the output nodes is small.

For a situation B2, assume that initially nodes Vin1p.1 and Vin2n.1 are high, and nodes Vin1n.1 and Vin2p.1 are low, Vctrl1 is high, and Vctrl2 is high. This assumption is the same as in situation B1 except that Vctrl1 is high instead of low.

Situation B2 is similar to situation B1; therefore, node Xb is low and node Yb is high. However, with Vctrl1 being high, both transistors M3b and M4b have low resistances. As a result, capacitor C3b is discharged, and capacitor C4b is charged.

Assume now that nodes Vin1p.1 and Vin2n.1 change from high to low, and nodes Vin1n.1 and Vin2p.1 change from low to high. Similar to situation B1, node Xb changes from low to high and node Yb changes from high to low.

However, because it takes time to charge up capacitor C3b, it takes more time for node Xb to switch from low to high than in Situation B1. Similarly, because it takes time to discharge capacitor C4b, it takes more time for node Yb to switch from high to low than in Situation B1. In short, raising Vctrl1 increases the delay time of the delay cell 310.1.

For a situation B3, assume that initially nodes Vin1p.1 and Vin2n.1 are high, and nodes Vin1n.1 and Vin2p.1 are low, Vctrl1 is low, and Vctrl2 is low. This assumption is the same as in situation B1, except that Vctrl2 is low instead of high. As a result, node Xb is low and node Yb is high as in situation B1. However, with Vctrl2 being low, both transistors M5b and M6b have low resistances (i.e., having low resistances). As a result, both capacitors C5b and C6b are charged.

Assume now that nodes Vin1p.1 and Vin2n.1 change from high to low, and nodes Vin1n.1 and Vin2p.1 change from low to high. Similar to situation B1, node Xb changes from low to high and node Yb changes from high to low. However, with transistors M5b and M6a having low resistances, when node Xb changes from low to high and node Yb changes from high to low, each of capacitors C5b and C6b is discharged and then recharged but with an opposite polarity. As a result, it takes more time for node Xb change from low to high and for node Yb to change from high to low than in situation B1. In short, lowering Vctrl2 also increases the delay time of the delay cell 310.1.

For a situation B4, assume that initially nodes Vin1p.1 and Vin2n.1 are high, and nodes Vin1n.1 and Vin2p.1 are low, Vctrl1 is high, and Vctrl2 is low. In this situation B4, the effects of situations B2 and B3 are combined so as to increase the delay time of the delay cell 310.1 more than in each of the situations B2 and B3.

More specifically, on one hand, with Vctrl1 being high, the loading on the nodes Xb and Yb is increased, therefore, it takes more time for nodes Xb and Yb to switch states. In other words, raising Vctrl1 increases the delay time of the delay cell 310.1. On the other hand, with Vctrl2 being low, the capacitance loading on nodes Xb and Yb caused by capacitors C5b and C6b are increased even more, therefore lowering Vctrl2 increases the delay time of the delay cell 310.1 even more.

In summary, the use of the two control signals Vctrl1 and Vctrl2 helps expand the delay time of the delay cell 310.1 to a new high (by pulling Vctrl1 high and pulling Vctrl2 low as illustrated in situation B4 above) and a new low attained by pulling Vctrl1 low and Vctrl2 high as in situation B1.

In one embodiment, the delay cells 310.2–310.6 have a structure similar to that of the delay cell 310.1. As a result, the operating frequency range of the VCO 300 can be expanded to a new lower bound and a new higher bound using both the control signals Vctrl1 and Vctrl2.

In the embodiments described above, the VCO 100 has three delay cells 110. In general, the VCO 100 can have N delay cells 110, N is an integer not less than 3.

In the embodiments described above, the VCO 300 has six delay cells 310. In general, the VCO 300 can have M delay cells 110, M is an integer not less than 3.

In the embodiments described above, transistors are used. In general, any logic gates can be used.

In one embodiment, with reference to FIG. 2, the control signal Vcntrl2 and its associated components comprising transistor M5b, capacitor C5b, transistor M6b, and capacitor C6b can be omitted. Similarly, with reference to FIG. 4, the control signal Vctrl2 and its associated components comprising transistors M7a, M5a, M8a, and M6a, and capacitor C5a and C6a can be omitted.

In the embodiments described above, all delay cells in the VCO 100 and 200 receive the same control signals. In general, each delay cell can receive its own separate control signals.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A delay cell, comprising:
   a latch comprising a first circuit and a second circuit being cross-coupled together;
   a first transistor circuit and a first circuit capacitor both being electrically coupled to an output of the first circuit such that the first circuit, the first transistor circuit, and the first circuit capacitor being in series; and
   a first input transistor electrically coupled to said output of the first circuit, wherein the first input transistor is configured to switch states in response to a voltage level of a gate terminal of the first input transistor, and wherein the first and second circuits are configured to switch states at time t1 in response to the first input transistor switching states at time t2, wherein a delay time between t1 and t2 depends on a voltage level of a gate terminal or the first transistor circuit.

2. The delay cell of claim 1, further comprising a second transistor circuit and a second circuit capacitor both electrically coupled to the second circuit such that the second circuit, the second transistor circuit, and the second circuit capacitor being in series, wherein the delay time between t1 and t2 further depends on a voltage level of a gate terminal of the second transistor circuit.

3. The delay cell of claim 2, wherein the gate terminal of the first transistor circuit and the gate terminal of the second transistor circuit are electrically coupled together.

4. The delay cell of claim 1, further comprising:
   a first pull-up transistor circuit electrically coupled between the output of the first circuit and a voltage supply;
   a first gate-terminal capacitor; and
   a first gate-terminal transistor circuit,
   wherein the first gate-terminal capacitor and the first gate-terminal transistor circuit are electrically coupled together such that the first gate-terminal capacitor and the first gate-terminal transistor circuit are in series between an input of the first circuit and a gate terminal of the first pull-up transistor circuit, and wherein the time delay between t1 and t2 further depends on voltage level of a gate terminal of the first gate-terminal transistor circuit.

5. The delay cell of claim 4, further comprising:
   a second pull-up transistor circuit electrically coupled between the input of the first circuit and the voltage supply;
   a second gate-terminal capacitor; and
   a second gate-terminal transistor circuit,
   wherein the second gate-terminal capacitor and the second gate-terminal transistor circuit are electrically coupled together such that the second gate-terminal capacitor and the second gate-terminal transistor circuit are in series between the output of the first circuit and a gate terminal of the second pull-up transistor circuit, and wherein the time delay between t1 and t2 further depends on a voltage level of gate terminal of second gate-terminal transistor circuit.

6. The delay cell of claim 5, wherein the gate terminal of the first gate-terminal transistor circuit and the terminal or the second gate-terminal transistor circuit are electrically coupled together.

7. The delay cell of claim 1, further comprising a second input transistor electrically coupled to an input of the first circuit, wherein the second input transistor is configured to have states opposite to that of the first input transistor gate.

8. The delay cell of claim 1, further comprising:
   a cross-output transistor circuit; and
   a cross-output capacitor,
   wherein the cross-output transistor circuit and the cross-output capacitor are electrically coupled together such that the cross-output transistor circuit and the cross-output capacitor are in series between the output of the first circuit and an output of the second circuit, and wherein the time delay between t1 and t2 further depends on a voltage level of a gate terminal of the cross-output transistor circuit.

9. A method for operating a delay cell, the method comprising the steps of:
   providing in the delay cell (i) a latch comprising a first circuit and a second circuit being cross coupled together, (ii) a first transistor circuit and a first circuit capacitor both being electrically coupled to an output of the first circuit such that the first circuit, the first transistor circuit, and the first circuit capacitor being in series, and (iii) a first input transistor electrically coupled to said output of the first circuit;
   switching states of the first input transistor in response to a voltage level of a gate terminal of the first input transistor; and
   switching states of the first and second circuits at time t1 in response to the first input transistor switching states at time t2, wherein a delay time between t1 and t2 depends on a voltage level of a gate terminal of the first transistor circuit.

10. The method of claim 9, further comprising the steps of:

providing further in the delay cell a second transistor circuit and a second circuit capacitor both electrically coupled to the second circuit such that the second circuit, the second transistor circuit, and the second circuit capacitor being in series; and switching states of the first and second circuits in response to the first input transistor switching states, with the delay time between t1 and t2 depends on a voltage level of a gate terminal of the second transistor circuit.

11. The method of claim 10, wherein the gate terminal of the first transistor circuit and the gate terminal of the second transistor circuit are electrically coupled together.

12. The method of claim 9, further comprising the steps of:

providing further in the delay cell (i) a first pull-up transistor circuit electrically coupled between the output of the first circuit and the voltage supply, (ii) a first gate-terminal capacitor, and (iii) a first gate-terminal transistor circuit, wherein the first gate-terminal capacitor and the first gate-terminal transistor circuit being electrically coupled together such that the first gate-terminal capacitor and the first gate-terminal transistor circuit are in series between an input of the first circuit and a gate terminal of the first pull-up transistor circuit; and switching states of the first and second circuits in response to the first input transistor switching states, with the delay time between t1 and t2 depends on a voltage level of a gate terminal of the first gate-terminal transistor circuit.

13. The method of claim 12, further comprising the steps of:

providing further in the delay cell (i) a second pull-up transistor circuit electrically coupled between the input of the first circuit and the voltage supply, (ii) a second gate-terminal capacitor, and (iii) a second gate-terminal transistor circuit, wherein the second gate-terminal capacitor and the second gate-terminal transistor circuit being electrically coupled together such that the second gate-terminal capacitor and the second gate-terminal transistor circuit are in series between the output of the first circuit and a gate terminal of the second pull-up transistor circuit; and switching states of the first and second circuits in response to the first input transistor switching states, with the delay time between t1 and t2 depends on a voltage level of a gate terminal of the second gate-terminal transistor circuit.

14. The method of claim 13, wherein the gate terminal of the first gate-terminal transistor circuit and the gate terminal of the second gate-terminal transistor circuit are electrically coupled together.

15. The method of claim 9, further comprising the steps of:

providing in the delay cell a second input transistor electrically coupled to an input of the first circuit; and switching states of the second input transistor in response to the first input transistor switching states such that the states of the second input transistor are opposite of that of the first input transistor.

16. The method of claim 9, further comprising the steps of:

providing further in the delay cell (i) a cross-output transistor circuit, and (ii) a cross-output capacitor, the cross-output transistor circuit and the cross-output capacitor being electrically coupled together such that the cross-output transistor circuit and the cross-output capacitor are in series between the output of the first circuit and an output of the second circuit; and switching states of the first and second circuits in response to the first input transistor switching states, with the delay time between t1 and t2 depends on a voltage level of a gate terminal of the cross-output circuit.

17. A structure, comprising:

a latch;

an input transistor, electrically coupled to a first output of the latch; and a first impedance circuit electrically coupled to the first output of the latch such that the first impedance circuit and the latch are in series, wherein the first impedance circuit is configured such that a resistance of the first impedance circuit changes in response to a control signal, and wherein the latch is configured to switch states at time t1 in response to the input transistor switching states at time t2, wherein a delay time between t1 and t2 depends on a resistance of the first impedance circuit.

18. The structure of claim 17, wherein the first impedance circuit comprises a latch-coupled capacitor and a latch transistor circuit electrically coupled in series, wherein a resistance of the latch transistor circuit depends on a voltage level at a gate terminal of the latch transistor circuit.

19. The structure of claim 17, further comprising:

a pull-up transistor circuit electrically coupled between the first output of the latch and a voltage supply; and a second impedance circuit electrically coupled between a second output of the latch and a gate terminal of the pull-up transistor circuit, wherein the delay time between t1 and t2 further depends on a resistance of the second impedance circuit.

20. The structure of claim 19, wherein the second impedance circuit comprises a gate-terminal capacitor and a gate-terminal transistor circuit electrically coupled in series, and wherein a resistance of the gate-terminal transistor circuit depends on a voltage level at a gate terminal of the gate-terminal transistor circuit.

* * * * *

UNITED STATES PATENT AND TRADEMARK OFFICE
CERTIFICATE OF CORRECTION

PATENT NO. : 6,943,608 B2
DATED : September 13, 2005
INVENTOR(S) : Kelkar

It is certified that error appears in the above-identified patent and that said Letters Patent is hereby corrected as shown below:

Column 9,
Line 53, delete "or" and insert -- of --.

Column 10,
Line 9, delete "on" and insert -- on a --.
Line 26, delete "of gate" and insert -- of a gate --.
Line 29, delete "terminal or" and insert -- terminal of --.
Line 35, delete "transistor gate" and insert -- transistor --.

Column 12,
Line 19, delete "cross-output circuit" and insert -- cross-output transistor circuit --.

Signed and Sealed this

Twenty-ninth Day of November, 2005

JON W. DUDAS
*Director of the United States Patent and Trademark Office*